(12) United States Patent
Feld et al.

(10) Patent No.: US 6,266,357 B1
(45) Date of Patent: Jul. 24, 2001

(54) MICROCAVITY SURFACE EMITTING LASER

(75) Inventors: Stewart Feld, Centerville; John P. Loehr, Kettering, both of OH (US); James A. Lott, Livermore, CA (US); Michael J. Noble, Hanscom, MA (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 0 days.

(21) Appl. No.: 09/386,821

(22) Filed: Aug. 31, 1999

Related U.S. Application Data
(60) Provisional application No. 60/098,758, filed on Sep. 1, 1998.

(51) Int. Cl.[7] .................................................. H01S 5/183
(52) U.S. Cl. .................................. 372/46; 372/45; 372/96
(58) Field of Search ................................ 372/45, 46, 96

(56) References Cited

U.S. PATENT DOCUMENTS

| | | | |
|---|---|---|---|
| 5,724,374 * | 3/1998 | Jewell | 372/96 |
| 5,729,566 * | 3/1998 | Jewell | 372/96 |
| 5,764,671 * | 6/1998 | Lebby et al. | 372/96 |
| 5,809,051 * | 9/1998 | Oudar | 372/96 |
| 5,956,363 * | 9/1999 | Lebby et al. | 372/96 |
| 5,978,408 * | 11/1999 | Thornton | 372/96 |
| 6,144,682 * | 11/2000 | Sun | 372/96 |
| 6,185,241 * | 2/2001 | Sun | 372/96 |
| 6,195,380 * | 2/2001 | Shih et al. | 372/96 |

* cited by examiner

*Primary Examiner*—James W. Davie
(74) *Attorney, Agent, or Firm*—Tony Y. Cole; Bobby D. Scearce; Thomas L. Kundert

(57) ABSTRACT

A three-dimensional waveguiding structure for a microcavity surface-emitting laser is described in which native aluminum oxide layers provide control of intracavity waveguiding and the laser optical mode structure of the emitted beam. Microcavity lasers described herein account for the blueshift of the emission wavelength as the laser lateral dimensions are reduced to or below the emission wavelength.

3 Claims, 6 Drawing Sheets

MICROCAVITY SURFACE EMITTING LASER

This application claims the benefit of Provisional Application Ser. No. 60/098,758 filed Sep. 1, 1998.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to surface emitting lasers, and more particularly to an improved vertical microcavity surface emitting laser diode structure.

Vertical-microcavity surface-emitting laser diodes (microlasers), as single devices or in one or two dimensional arrays, are candidate replacements for vertical-cavity surface-emitting lasers (VCSELs) in various low to moderate power applications such as optical interconnects, datalinks, and printing, display and spectroscopic sensor devices, because the microlaser offers improved threshold current and more stable single (fundamental) mode lasing.

A microlaser is similar to a VCSEL except that the microlaser optical cavity dimensions are all on the order of the emission wavelength. The length of the optical cavity along the resonant direction (normal to the planar layer interfaces, nominally the z direction in Cartesian coordinates) is roughly one-half of the emission wavelength. The width of the cavity (in the x and y directions) is approximately less than five times the emission wavelength. In contrast, although a VCSEL cavity may have the same length as a microlaser, the width of the VCSEL cavity is at least five times the emission wavelength and generally much greater than this.

Prior art laser diode devices have not provided for microlaser resonant emission wavelength blueshifting, i.e. shifting to shorter wavelength, for transverse microlaser dimensions equal to or less than the peak emission wavelength. The resonant cavity of the prior art devices along the axial (z) direction must therefore be carefully sized in order to minimize the threshold current density. Conventional laboratory VCSELs have threshold currents below one milliampere. Microlasers offer further reduction in threshold current due to their smaller active area and increased spontaneous emission coupling into the resonant lasing mode. Measurement of peak emission wavelength can be used as a quality/processing control step in the large-scale manufacturing of microlasers since it can be related to the success of an oxidation processing step.

A potential drawback of microlasers is multimode lasing. Traditionally, this occurs when the threshold gain of several transverse laser modes is comparable and more than one mode can acquire sufficient gain to lase. However, with ajudicious selection of gain material, this potential problem can be overcome. In accordance with a principal feature of the invention, if the gain spectrum is sufficiently narrow—as is possible in quantum dots—only the fundamental mode may lase. According to the invention, the spectral separation between the fundamental and higher order lasing modes, due to the difference in the mode blueshifts, is exploited to achieve single mode lasing.

It is therefore a principal object of the invention to provide an improved microcavity surface-emitting laser.

It is a further object of the invention to provide an intracavity waveguiding structure for a microcavity surface-emitting laser.

It is yet another object of the invention to provide a microcavity surface-emitting laser having a three-dimensional waveguiding structure using native aluminum oxide layers.

It is yet another object of the invention to provide an improved microlaser, which corrects for emission wavelength blueshift caused by reduced lateral waveguiding geometry of the structure.

It is yet a further object of the invention to provide a microlaser structure having improved side mode suppression through spectral separation of the fundamental and higher-order lasing modes.

These and other objects of the invention will become apparent as a detailed description of representative embodiments proceeds.

SUMMARY OF THE INVENTION

In accordance with the foregoing principles and objects of the invention, a three-dimensional waveguiding structure for microcavity surface-emitting lasers is described wherein native aluminum oxide layers provide control of intracavity waveguiding and the laser optical mode structure of the emitted beam. Microcavity lasers described herein account for the blueshift of the emission wavelength as the laser lateral dimensions are reduced to or below the emission wavelength.

DESCRIPTION OF THE DRAWINGS

The invention will be more clearly understood from the following detailed description of representative embodiments thereof read in conjunction with the accompanying drawings wherein.

DETAILED DESCRIPTION

Theoretical considerations and underlying principles of operation of the invention may be found by reference to M. J. Noble et al, "Calculation of threshold gain for oxide-apertured VCSELs via the weighted index method with parasitic mode loss," *IEEE Journal of Quantum Electronics* (To be submitted in September 1999); to M. J. Noble et al, "Overview of Air Force in-house VCSEL modeling work," *IEEE Summer Topical Meetings: Vertical-Cavity Lasers*, San Diego, Calif. (Jul. 28–30, 1999); to M. J. Noble et al, "Microcavity surface-emitting laser simulation using vector finite elements," *DoD HPCMP Users Group Conference Proceedings*, Monterey, Calif. (Jun. 7–10, 1999); to M. J. Noble et al, "Comparison of optical analysis methods for oxide-apertured VCSELs," Proceedings of the SPIE, 3625–41, in *Physics and Simulation of Optoelectronic Devices VII*, San Jose, Calif. (Jan. 25–29, 1999); to M. J. Noble et al, "Semi-analytic calculation of diffraction losses and threshold currents in microcavity VCSELs," IEEE Lasers and Electro-Optics Society 1998 Annual Meeting in *LEOS '98 Conference Proceedings*, Orlando, Fla. (Dec. 1–4 1998); to M. J. Noble et al, "Quasi-exact optical analysis of oxide-apertured microcavity VCSELs using vector finite elements," *IEEE Journal of Quantum Electronics*, Vol 34, No 12, (December 1998) 2327–2339; to M. J. Noble et al, "Analysis of microcavity VCSEL lasing modes using a full-vector weighted index method," *IEEE Journal of Quantum Electronics*, Vol 34, No 10, (October 1998) 1890–1903; to J. A. Lott et al, "Measurement of resonant-mode blueshifts in quantum dot vertical cavity surface emitting lasers," Proceedings of the SPIE, 3419–32, in *Optoelectronic Materials and Devices*, Taipei, Taiwan (Jul. 9–11, 1998); to M. J. Noble et al, "Calculation and measurement of resonant-mode blueshifts in oxide-apertured VCSELs," *IEEE Photonics Technology Letters*, Vol 10, No 4, (April 1998) 475–477; to J. P. Loehr et al, "Effects of native oxides and optical confinement on microcavity VCSEL spontaneous emission," Proceedings of the SPIE, 3283–91, in *Physics and Simulation of Optoelectronics Devices VI*, San Jose, Calif. (Jan. 26–30, 1998); to M. J. Noble et al, "Calculation of microcavity VCSEL field modes using a doubly iterative weighted index method," Proceedings of the SPIE, 2994–25, in *Physics and Simulation of Optoelectronics Devices V*, San Jose, Calif. (Feb. 8–14, 1997); to M. J. Noble et al, "Design of low-threshold, single-transverse mode VCSLLs using the transverse confinement optical mode separation," *OSA Trends in Optics and Photonics*, Vol 15 *Advances in Vertical Cavity Surface Emitting Lasers*, C. Chang-Hasnain, Ed. (1997) the entire teachings of which are incorporated by reference herein.

Figure 1:
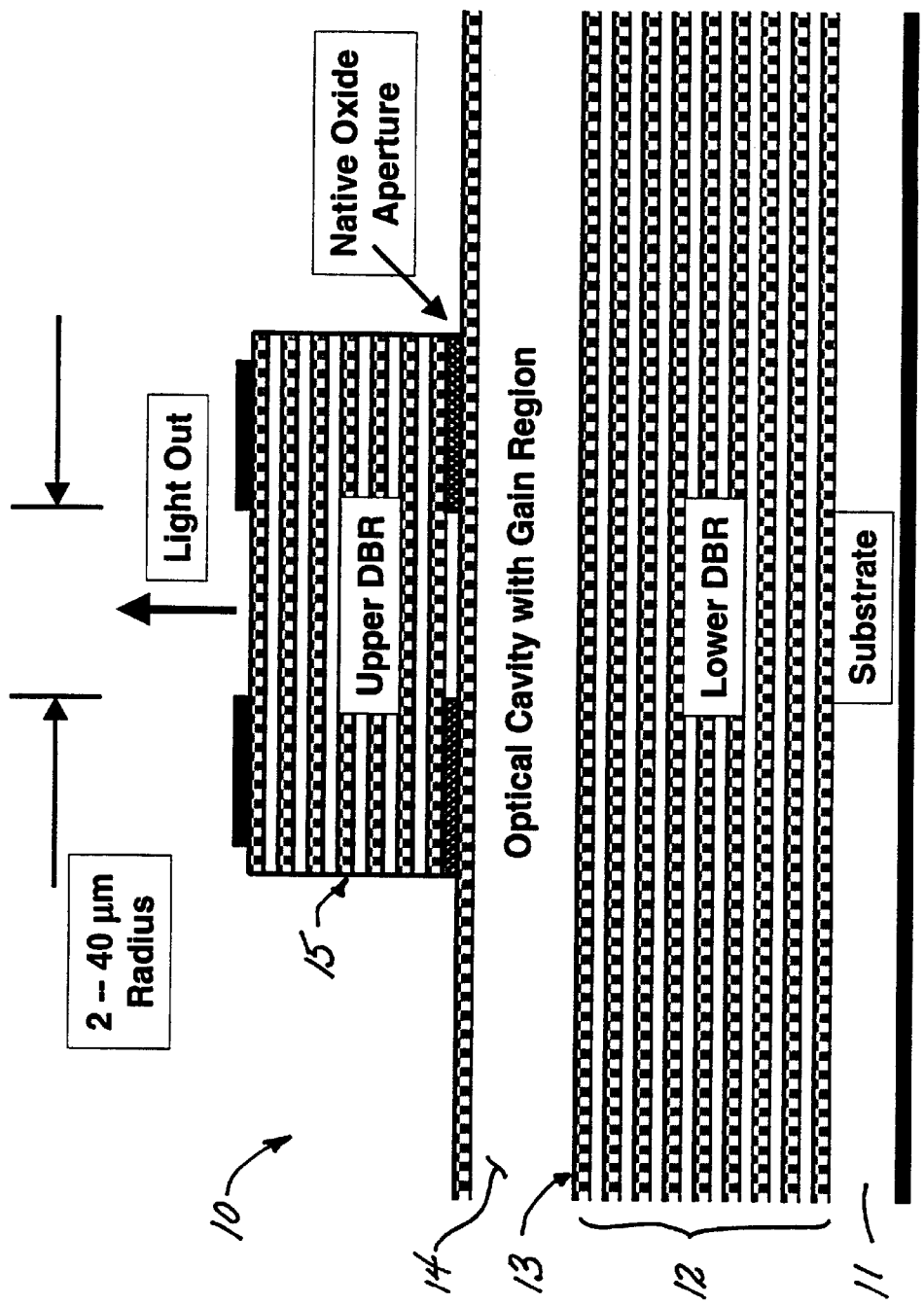
FIG. 1 is a schematic diagram in axial section of a vertical-cavity surface-emitting laser.
Figure 2:
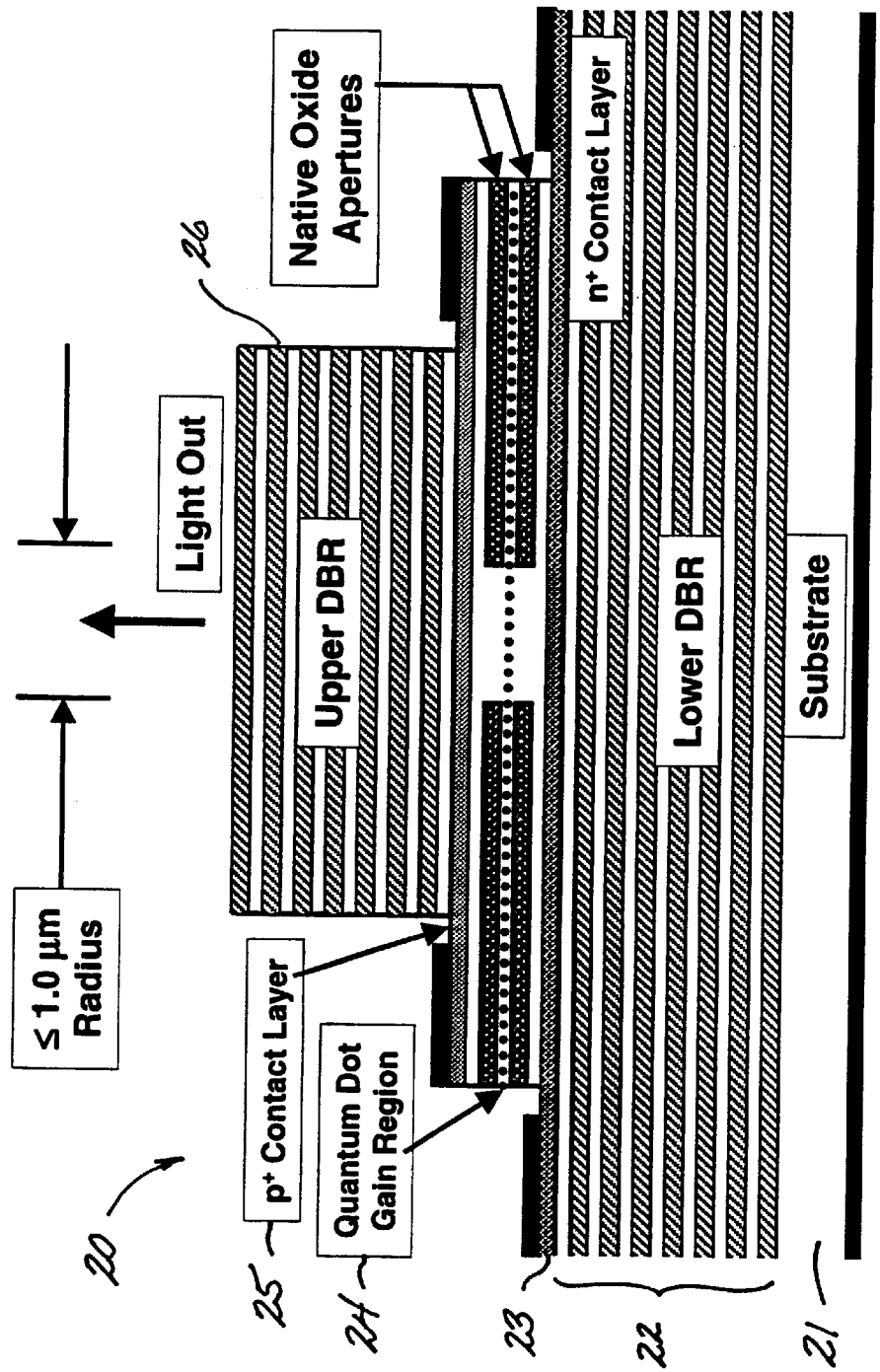
FIG. 2 is a schematic diagram in axial section of a microcavity surface-emitting laser.

Referring now to the drawings, FIG. 1 is a schematic diagram in axial section of an example VCSEL 10, and FIG. 2 is a schematic diagram in axial section of an example microlaser 20. The VCSEL 10 may be prepared by conventional vapor deposition processes, including semiconductor epitaxial growth techniques such as molecular beam epitaxy, metal-organic vapor-phase epitaxy, or other conventional processes as would occur to the skilled artisan. On substrate 11, preferably comprising GaAs or other suitable substrate material, quarter-wave thick layers 12 of $Al_xGa_{1-x}As$ and $Al_yGa_{1-y}As$ (x not equal to y) are deposited in order to form a lower distributed Bragg reflector (DBR) mirror 13. An optical cavity 14, roughly an integral number of half-emission-wavelengths long, with the active/gain region of $In_{0.2}Ga_{0.8}As$ is deposited next. The second (upper) DBR mirror 15 is then applied as suggested in FIG. 1. This DBR may be made of semiconductor material, in which case the growth is similar to the lower DBR, or of dielectrics such as ZnSe, MgF, or CaF. If a dielectric top DBR is employed, the dielectrics are deposited, following the epitaxial growth of the optical cavity 14, using standard thin-film deposition techniques. These layers form the resonant cavity (or z-axis waveguide) of the VCSEL 10.

The microlaser is prepared similar to the VCSEL with a few significant exceptions. Using standard semiconductor epitaxial growth techniques, a lower DBR 22 of (intrinsic) GaAs/AlAs is deposited on a GaAs substrate 21. The AlAs layers are designed such that, when fully oxidized such that the layer becomes a native aluminum oxide (AlO), the layer is a quarter-wave thick. On top of the bottom DBR is grown an n+-type GaAs contact layer 23, followed by a half-emission-wavelength long optical cavity with $In_{0.2}Ga_{0.8}As$ active/gain region 24, and a p+-type GaAs contact layer 25. Within the half-wave cavity are included two $Al_{0.97}Ga_{0.03}As$ layers, one above and one below the gain region, which, when oxidized, will form circular current and optical waveguiding apertures. Following the p+-type GaAs contact layer, an intrinsic upper GaAs/AlAs DBR 26 is deposited analogous to the lower DBR. Alternately, post-growth deposited dielectric DBRs may be substituted for one or both of the GaAs/AlO DBRs. These dielectric DBRs are similar to the one described in the previous paragraph. In either case, the important requirement is that both the bottom and top DBRs be formed from high-index-contrast material pairs with at least a two-to-one difference in index of refraction.

The example structures discussed so far are designed for a peak emission wavelength of 0.98 micrometers. Similar structures designed for emission at wavelengths from the ultraviolet to the infrared are also possible by judicious selection of semiconductor and other materials.

The next step in both the VCSEL and microlaser fabrication is to define the device's lateral (x and y) extent by means of conventional microelectronic processing techniques and native oxidation. Fabrication of VCSELs currently involves wet or plasma etching of mesas and use of native aluminum oxide layers to define a current aperture. The current aperture is generally 4 microns or larger in diameter, corresponding to roughly 12 times the emission wavelength. The microlaser is formed by using reactive ion etching to etch through the top DBR, the cavity, and the bottom DBR, down to the substrate, to form a large diameter (>6 microns in diameter) mesa. The exact mesa diameter is determined by the oxidation rates of the AlAs and $Al_{0.97}Ga_{0.03}As$ layers. The mesa is then exposed to steam to oxidize the AlAs and $Al_{0.97}Ga_{0.03}As$ layers. Since the two materials oxidize at different rates, the AlAs layers are completely oxidized, while the $Al_{0.97}Ga_{0.03}As$ layers are incompletely oxidized to form a circular current aperture of roughly one micron in radius, corresponding to a rectangular aperture with side length roughly five times the emission wavelength.

Figure 3:
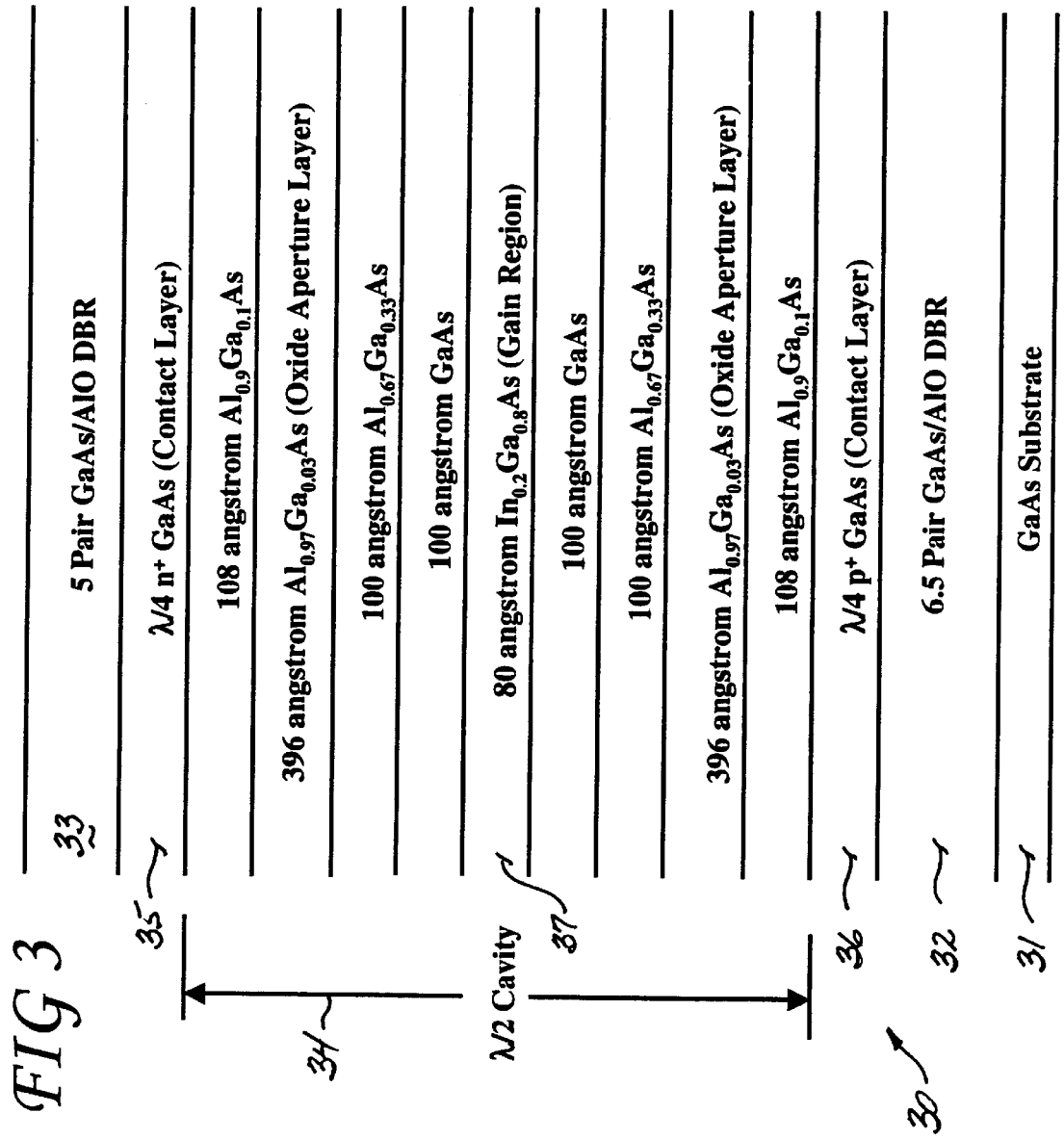
FIG. 3 is a schematic diagram of a representative embodiment of the microlaser structure of the invention having oxidized upper and lower DBR mirrors and a double oxide aperture in the half-wave cavity.

Referring now to FIG. 3, shown therein is a schematic diagram of a representative microlaser structure 30 of the invention. The structure is grown on a GaAs substrate 31 and consists of a 6.5-pair GaAs/AlO bottom DBR 32 and a 5-pair GaAs/AlO top DBR 33 surrounding a nominally half-wave cavity 34. Between cavity 34 and top DBR 33 is a quarter-wave thick p+-type GaAs contact layer 35, and between bottom DBR 32 and cavity 34 is a quarter-wave thick n+-type GaAs contact layer 36. The half-wave cavity 34 consists of a 108 angstrom layer of $Al_{0.9}Ga_{0.1}As$ followed by a 396 angstrom layer of $Al_{0.97}Ga_{0.03}As$, a 100 angstrom layer of $Al_{0.67}Ga_{0.33}As$, a 100 angstrom GaAs layer, and culminating in an 80 angstrom layer of quantum dots (gain region 37). Cavity 34 is symmetric about the quantum dot layer region 37. The dots are designed to emit at the blueshifted resonance, which for a 1.0-micron radius oxide aperture is 973 nanometers.

Figure 4:
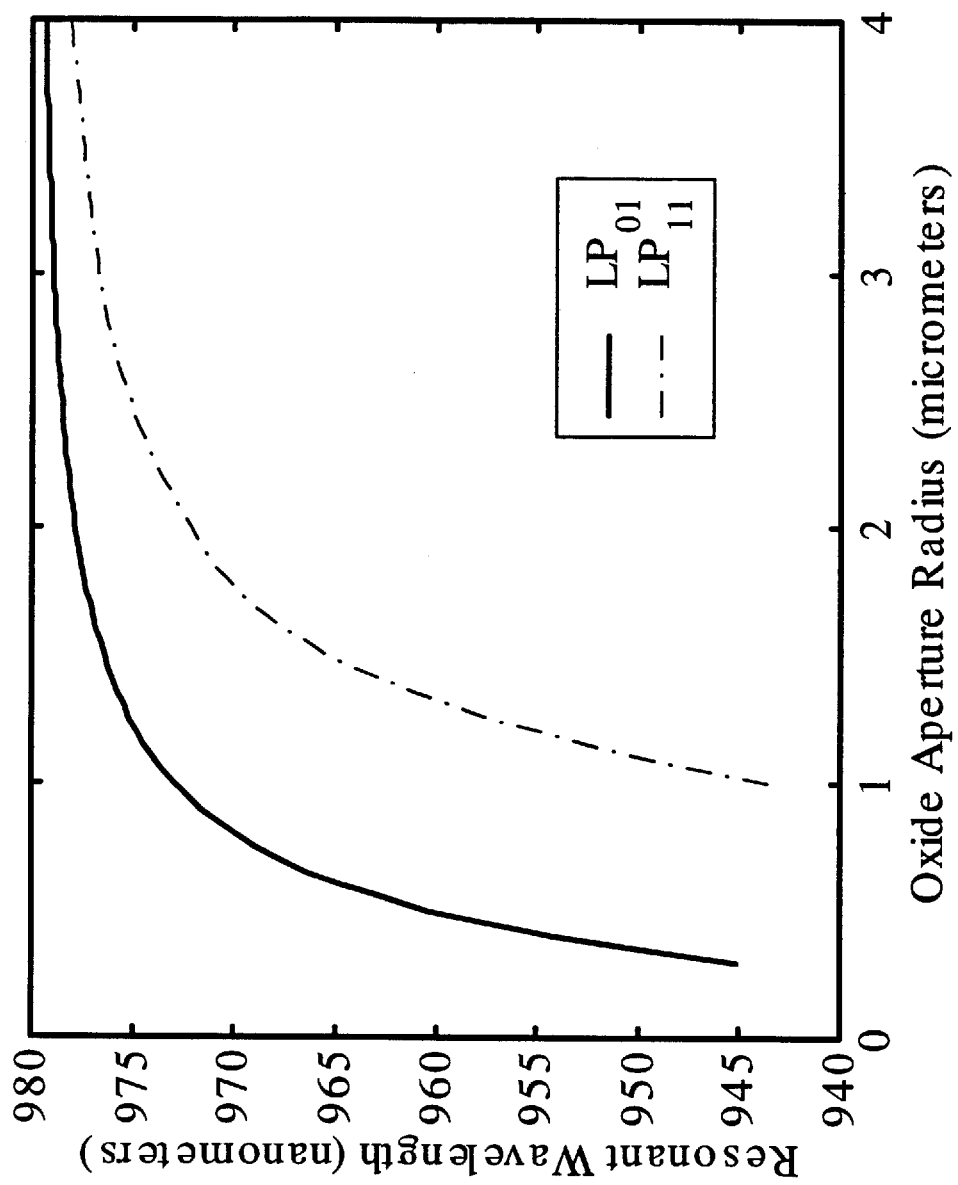
FIG. 4 is a plot of calculated emission wavelength versus oxide aperture radius for the fundamental lasing mode and the first higher-order mode of the microcavity surface-emitting laser structure of the invention.
Figure 5:
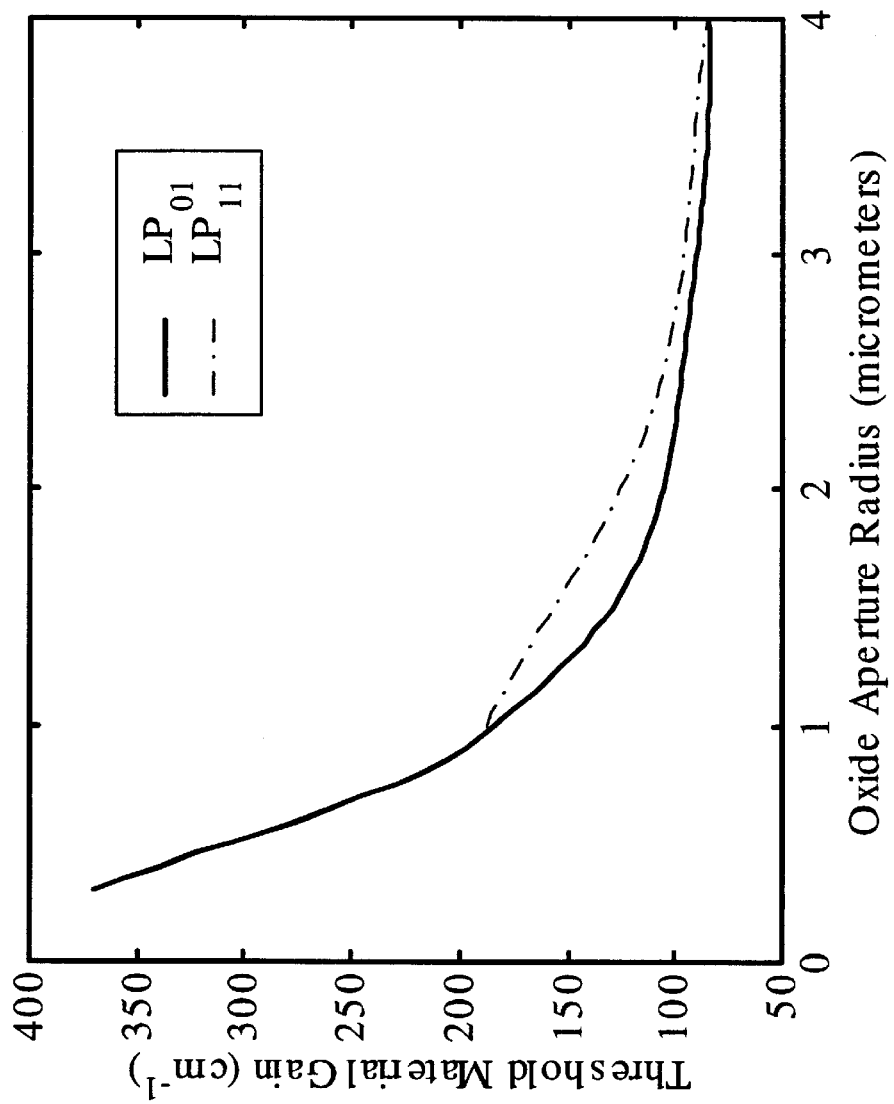
FIG. 5 is a plot of calculated threshold material gain versus oxide aperture radius for the fundamental lasing mode and the first higher-order mode of the microcavity surface-emitting laser structure of the invention.

FIG. 4 is a plot of calculated emission wavelength versus oxide aperture radius for the fundamental lasing mode (LP01) and the first higher-order mode (LP11) of the microcavity surface-emitting laser structure of the invention, and FIG. 5 is a plot of calculated threshold material gain versus oxide aperture radius for LP01 and LP11. The peak emission wavelength blueshifts as the radius of the oxide aperture is decreased. Furthermore, the fundamental and higher-order modes blueshift at a different rate—the higher the mode order, the larger the blueshift. This effect may be exploited to promote single-mode lasing, by employing a gain material with a narrow gain spectrum centered on the fundamental mode resonance. Such a gain spectrum can be achieved using uniform layers of quantum dots. This approach is in contrast to the more traditional technique of introducing mode selective losses such that the fundamental lasing mode threshold is much smaller than the higher order modes. This traditional technique is not possible within a microlaser because the fundamental and higher-order mode thresholds are nearly equal.

Figure 6:
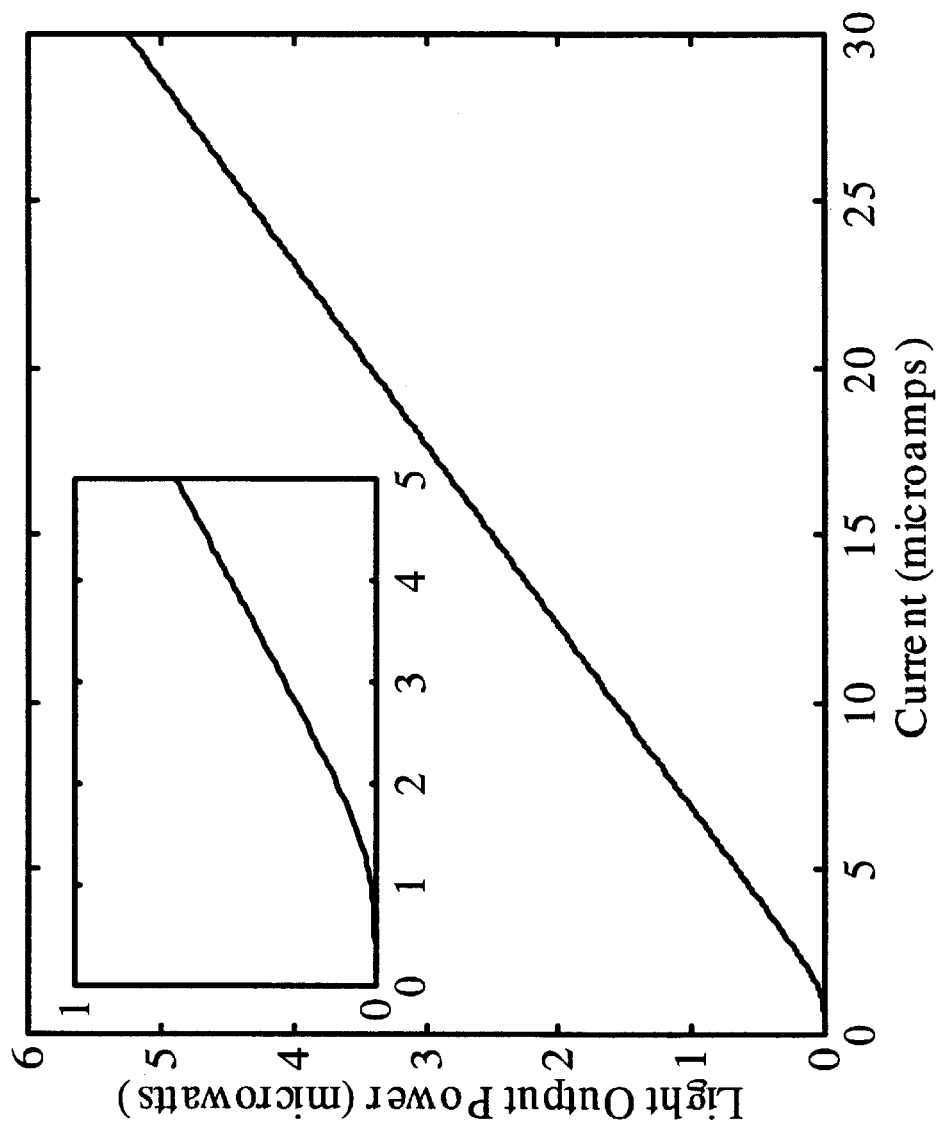
FIG. 6 is a plot of calculated light output versus current input for the microcavity surface-emitting laser structure of the invention with a one micron radius oxide aperture above and below the gain region.

FIG. 6 is a plot of calculated light output versus current input for the microcavity surface-emitting laser structure of the invention with a one micron radius oxide aperture above and below the gain region, built in demonstration of the invention. The threshold current is approximately 1 microamp and the spontaneous emission coupling factor—the percentage of spontaneously emitted photons coupling into the lasing mode—is approximately 0.119. The gain region is tuned to peak at 973 nanometers. The closest higher-order mode is resonant at 943.6 nanometers, which is over 29 nanometers away from the fundamental mode resonance. A gain profile peaked at 973 and negligible at 944 may be obtained using uniform quantum dots. Note that this spectral separation is the only way to achieve single mode lasing since the threshold gains (FIG. 5) of the fundamental and higher-order modes are nearly equal.

The entire teachings of all references cited herein are hereby incorporated by reference herein.

The invention therefore provides an improved microcavity surface emitting laser structure. It is understood that modifications to the invention may be made as might occur to one with skill in the field of the invention within the scope of the appended claims. All embodiments contemplated hereunder which achieve the objects of the invention have therefore not been shown in complete detail. Other embodiments may be developed without departing from the spirit of the invention or from the scope of the appended claims.

We claim:

1. A three-dimensional waveguiding structure for a microcavity surface-emitting laser in which native aluminum oxide layers provide control of intracavity waveguiding and the laser optical mode structure of the emitted beam, said waveguiding structure comprising:

(a) a substrate;

(b) a first distributed Bragg reflector mirror deposited on said substrate;

(c) a quarter wave p+ GaAs first contact layer deposited on said first Bragg reflector mirror;

(d) a half wave optical cavity deposited on said first contact layer, said cavity including a central layer of $In_{0.2}Ga_{0.8}As$ defining a gain region and a GaAs layer, an $Al_{0.67}Ga_{0.33}As$ layer, an $Al_{0.97}Ga_{0.03}As$ aperture layer and an $Al_{0.9}Ga_{0.1}As$ layer on each surface of said central layer;

(e) a quarter wave n+ GaAs second contact layer deposited on said cavity; and (f) a second distributed Bragg reflector mirror deposited on said second contact layer.

2. The structure of claim 1 wherein said substrate comprises GaAs.

3. The structure of claim 1 wherein said first and second distributed Bragg reflector mirrors comprise GaAs and AlO.

* * * * *